United States Patent
Ishimatsu et al.

(10) Patent No.: US 11,715,732 B2
(45) Date of Patent: Aug. 1, 2023

(54) SEMICONDUCTOR DEVICE HAVING WELL CONTACT DIFFUSION REGION SUPPLYING WELL POTENTIAL

(71) Applicant: Micron Technology, Inc., Boise, ID (US)

(72) Inventors: Moe Ishimatsu, Chofu (JP); Kiyotaka Endo, Kodaira (JP); Takanari Shimizu, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 318 days.

(21) Appl. No.: 17/105,102

(22) Filed: Nov. 25, 2020

(65) Prior Publication Data

US 2022/0165724 A1     May 26, 2022

(51) Int. Cl.
*H01L 27/02*     (2006.01)
*H01L 27/092*     (2006.01)
*H01L 23/528*     (2006.01)

(52) U.S. Cl.
CPC ........ *H01L 27/0207* (2013.01); *H01L 23/528* (2013.01); *H01L 27/0928* (2013.01)

(58) Field of Classification Search
CPC ............. H01L 27/0207; H01L 27/0928; H01L 23/528
See application file for complete search history.

(56) References Cited

U.S. PATENT DOCUMENTS

| | | | | |
|---|---|---|---|---|
| 2012/0126422 | A1* | 5/2012 | Endo .................. | H01L 23/5286 257/774 |
| 2013/0026580 | A1* | 1/2013 | Morimoto ............. | G11C 11/412 257/E27.099 |
| 2013/0228877 | A1* | 9/2013 | Sugimoto ......... | H01L 27/11807 257/401 |
| 2016/0372418 | A1* | 12/2016 | Utsumi ................. | H01L 23/485 |
| 2020/0251476 | A1* | 8/2020 | Chang .................. | H01L 23/535 |

* cited by examiner

*Primary Examiner* — Mounir S Amer
*Assistant Examiner* — Alexander Belousov
(74) *Attorney, Agent, or Firm* — Dorsey & Whitney LLP

(57) ABSTRACT

Disclosed herein is an apparatus that includes: a first diffusion region extending in a first direction; second diffusion regions arranged in the first direction; a first metallic line overlapping with the first diffusion region; second metallic lines each overlapping with an associated one of the second diffusion regions; a third metallic line overlapping with the first and second metallic lines; first contact plugs connecting the first metallic line to the first diffusion region; second contact plugs each electrically connecting an associated one of the second metallic lines to an associated one of the second diffusion regions; and third contact plugs each electrically connecting the third metallic line to an associated one of the second metallic lines.

19 Claims, 8 Drawing Sheets

SEMICONDUCTOR DEVICE HAVING WELL CONTACT DIFFUSION REGION SUPPLYING WELL POTENTIAL

BACKGROUND

In a semiconductor device, n-channel MOS transistors are formed in p-type wells and p-channel MOS transistors are formed in n-type wells. A well potential is supplied to the wells via well contact diffusion regions respectively connected to power lines. Since the well contact diffusion regions have higher resistances than those of the power lines, it is desirable to array contact plugs respectively connecting the well contact diffusion regions to the power lines at a shorter pitch.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
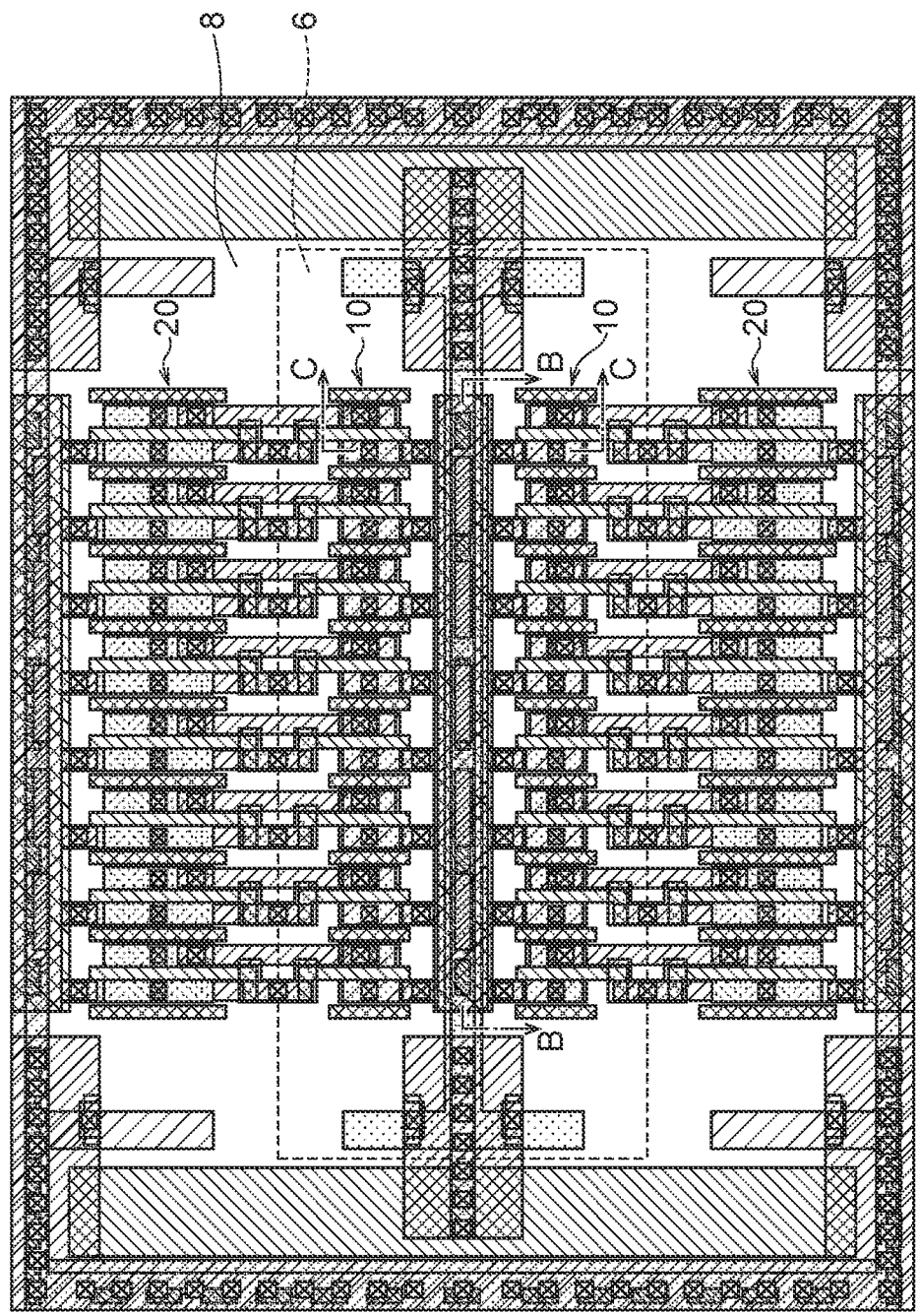
FIG. 1 is a schematic plan view showing a configuration of a main part of a semiconductor device according to the present disclosure.

A semiconductor device according to the present embodiment is a standard cell type semiconductor device and has cell regions N1, N2, P1, and P2 extending in an x direction as shown in FIG. 1. A plurality of n-channel MOS transistors 10 are arrayed in the x direction in the cell regions N1 and N2 and a plurality of p-channel MOS transistors 20 are arrayed in the x direction in the cell regions P1 and P2. The cell regions P1 and P2 are arranged to sandwich the cell regions N1 and N2 in a y direction.

Figure 2:
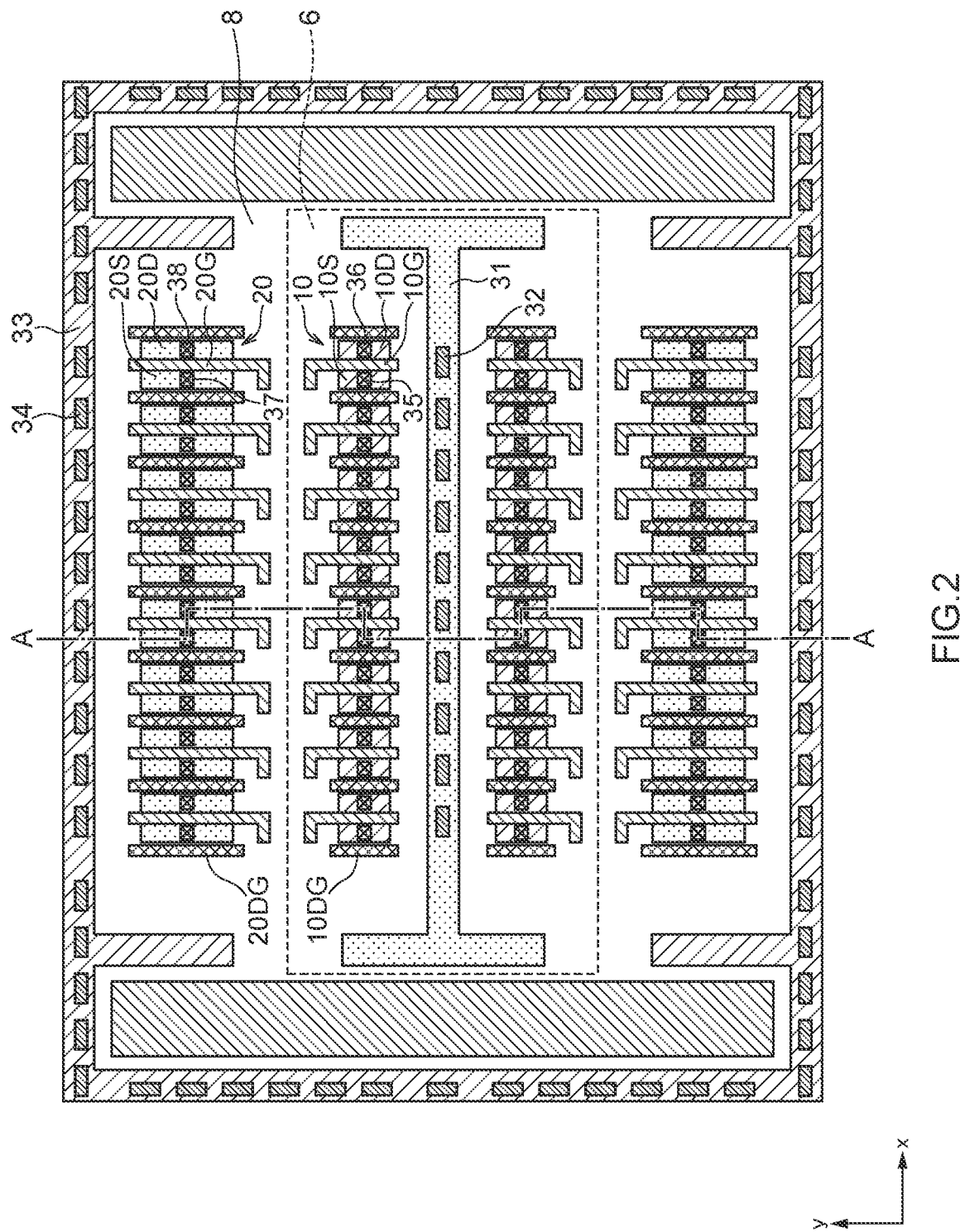
FIG. 2 is a schematic plan view in Which diffusion layers and gate electrodes are shown as these elements are extracted from the plan view of FIG. 1.
Figure 3:
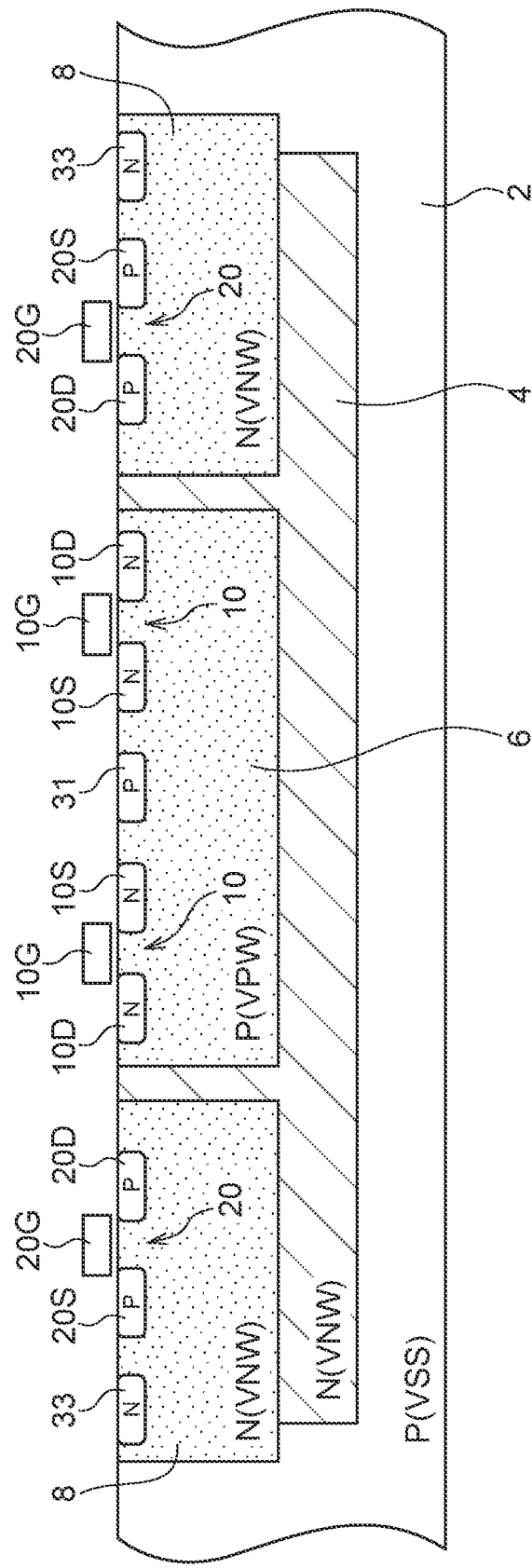
FIG. 3 is a schematic sectional view along a line A-A shown in FIG. 2.

As shown in FIGS. 2 and 3, a deep n-well region 4 is formed in a semiconductor substrate 2 made of p-type silicon. A p-well region 6 and an n-well region 8 are formed in the deep n-well region 4. The p-well region 6 is a region having a p-conductivity type in which the n-channel MOS transistors 10 are formed. A well potential VPW is supplied to the p-well region 6 via a well contact diffusion region 31. The well contact diffusion region 31 includes a p-type diffusion layer having a greater dopant concentration than that of the p-well region 6. The n-well region 8 is a region having a n-conductivity type in which the p-channel MOS transistors 20 are formed. The n-conductivity type is opposite to the p-conductivity type. A well potential VNW is supplied to the n-well region 8 via a well contact diffusion region 33. The well contact diffusion region 33 includes an n-type diffusion layer having a great dopant concentration than that of the n-well region 8. A ground potential VSS is supplied to the semiconductor substrate 2. The well contact diffusion region 31 is arranged to extend in the x direction between the cell region N1 and the cell region N2. The well potential VPW is supplied to the well contact diffusion region 31 via a plurality of contact plugs 32 extending in the x direction. The well contact diffusion region 33 is provided in a ring shape along the n-well region 8. The well potential VNW is supplied to the well contact diffusion region 32 via a plurality of contact plugs 34 extending in the x direction or the y direction.

Each of the n-channel MOS transistors 10 includes n-type source diffusion region 10S and drain diffusion region 10D, and a gate electrode 10G covering a channel region located between the source diffusion region 10S and the drain diffusion region 10D. Each of the p-channel MOS transistors 20 includes p-type source diffusion region 20S and drain diffusion region 20D, and a gate electrode 20G covering a channel region located between the source diffusion region 20S and the drain diffusion region 20D. A dummy gate electrode 10DG is provided between ones of the gate electrodes 10G adjacent in the x direction. A dummy gate electrode 20DG is provided between ones of the gate electrodes 20G adjacent in the x direction.

Figure 4:
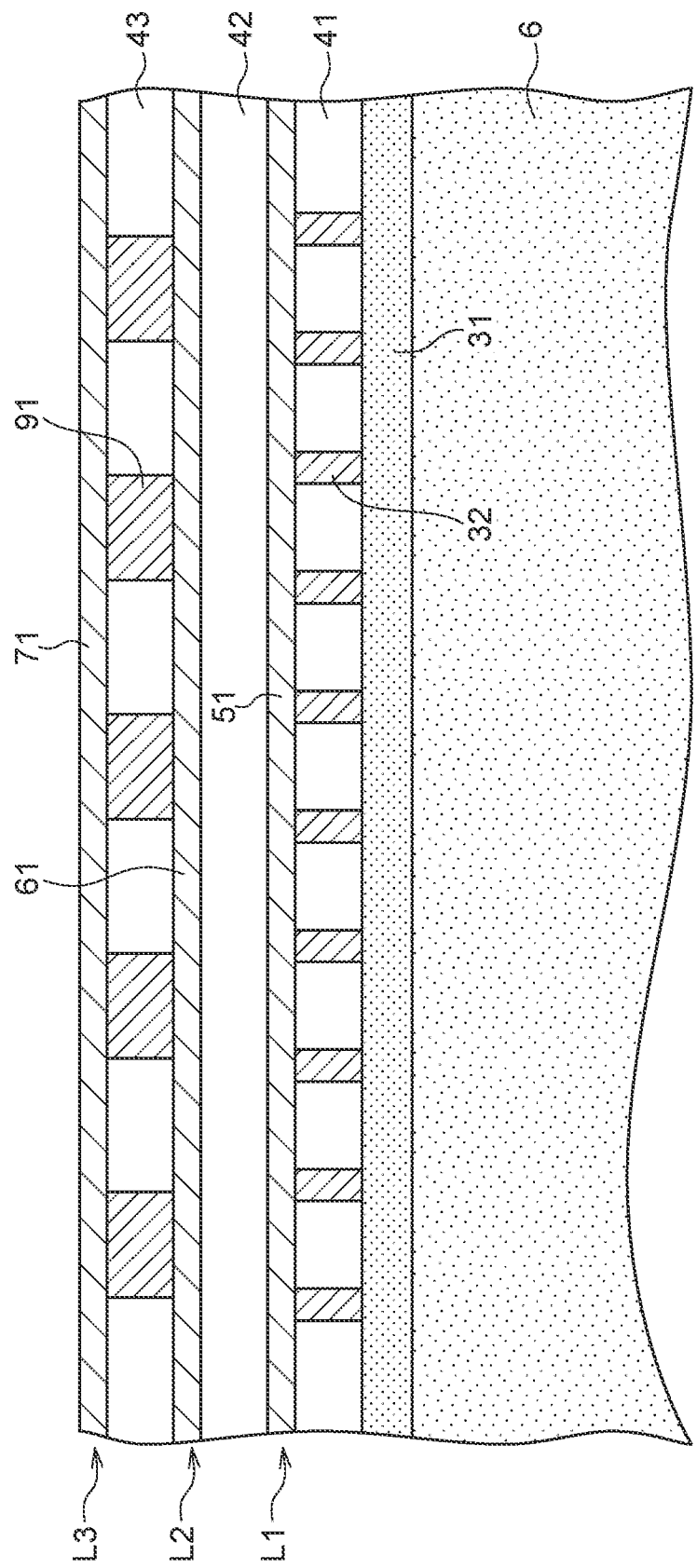
FIG. 4 is a schematic sectional view along a line B-B shown in FIG. 1.
Figure 5:
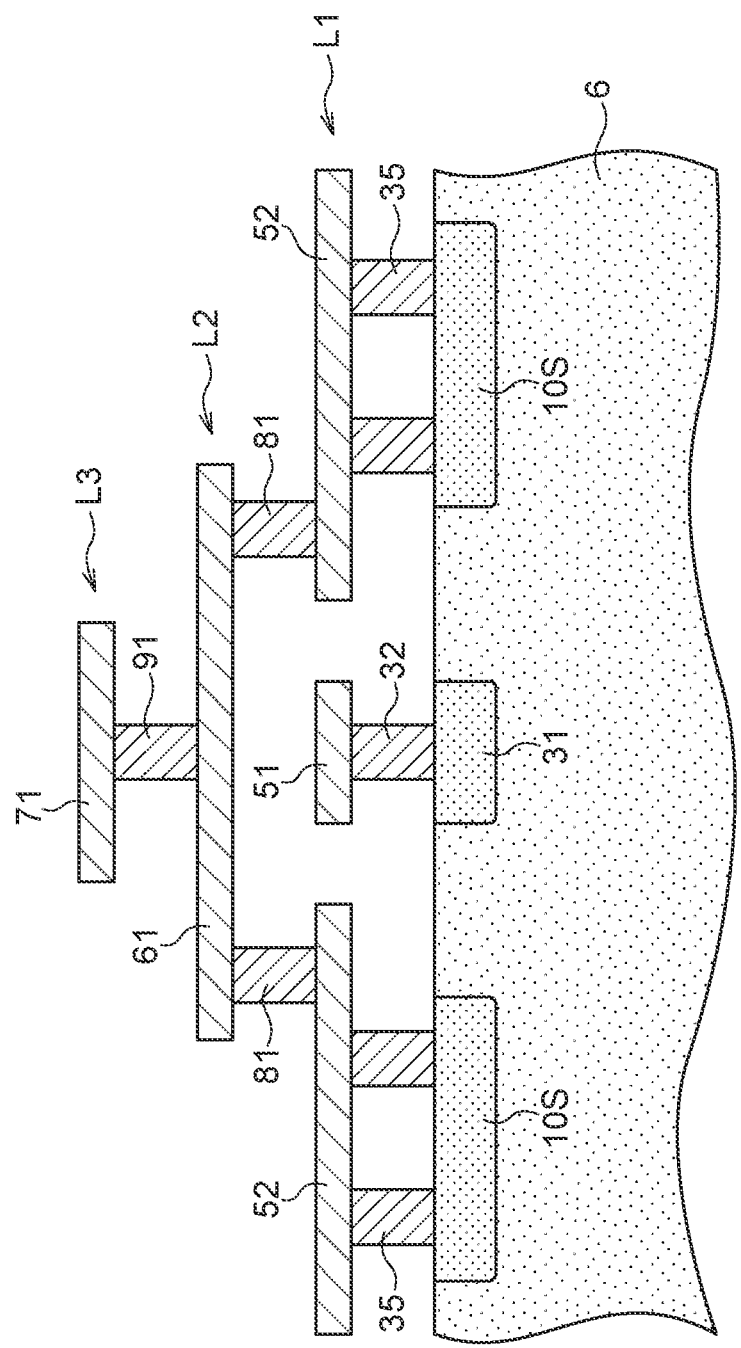
FIG. 5 is a schematic sectional view along a line C-C shown in FIG. 1.

As shown in FIGS. 4 and 5, wiring layers L1 to L3 are provided on the semiconductor substrate 2. The wiring layer L1 is located in the lowermost layer, the wiring layer L2 is located in a layer above the wiring layer L1, and the wiring layer L3 is located in a layer above the wiring layer L2. While there are further wiring layers above the wiring layer L3, these layers are omitted in FIGS. 4 and 5. The wiring layers L1 to L3 can be made of a metallic material such as aluminum, copper, or tungsten. An interlayer dielectric film 41 is provided between the semiconductor substrate 2 and the wiring layer L1, an interlayer dielectric film 42 is provided between the wiring layer L1 and the wiring layer L2, and an interlayer dielectric film 43 is provided between the wiring layer L2 and the wiring layer L3.

Figure 6:
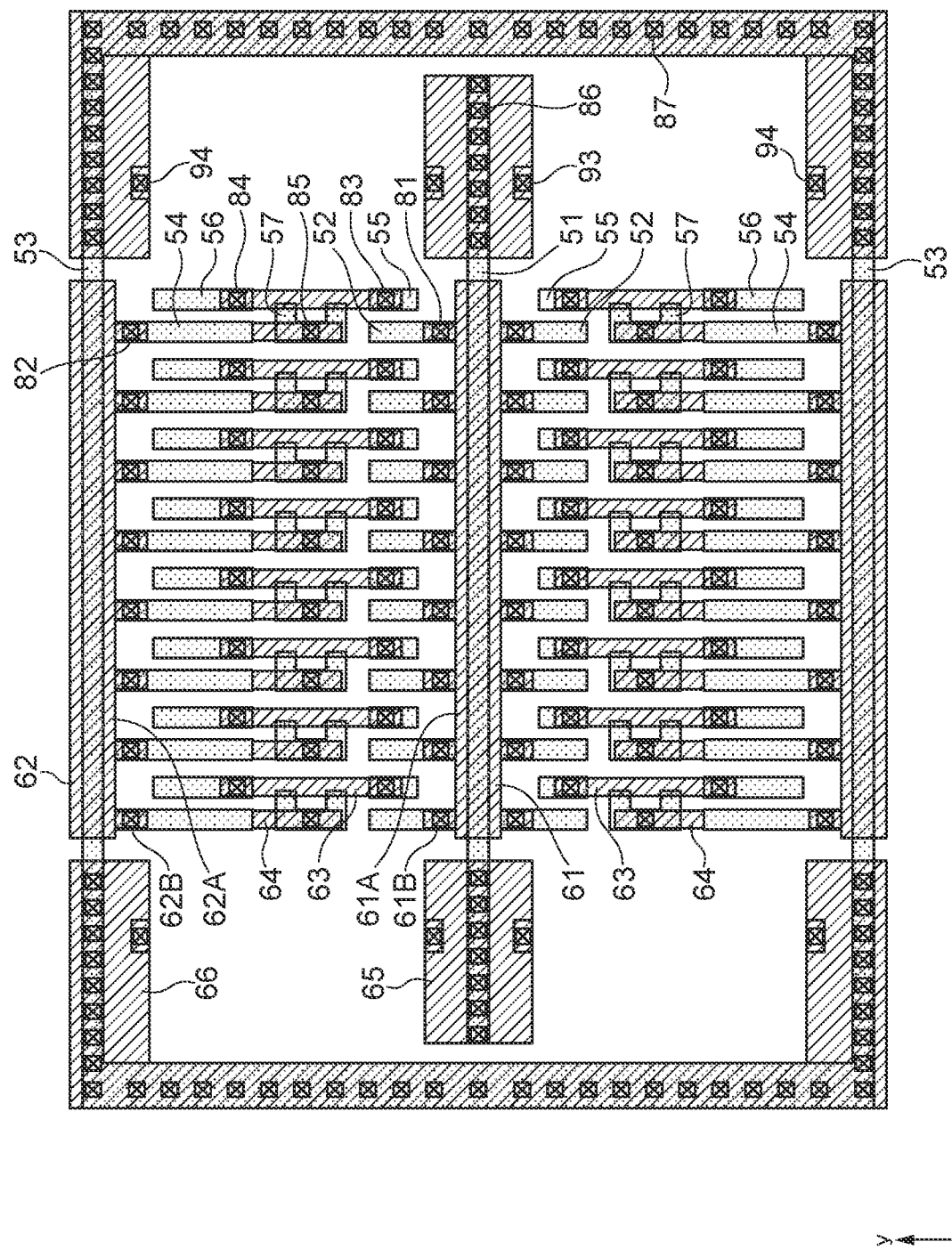
FIG. 6 is a schematic plan view in which first and second wiring layers are shown as these layers are extracted from the plan view of FIG. 1.

As shown in FIG. 6, wiring patterns 51 to 57 are provided on the wiring layer L1. The wiring pattern 51 extends in the x direction so as to overlap with the well contact diffusion region 31. The wiring pattern 51 and the well contact diffusion region 31 are connected to each other via a plurality of contact plugs 32 provided to penetrate through the interlayer dielectric film 41. "Connected" may include physically connected and/or electrically connected. The wiring patterns 52 each extend in the y direction so as to overlap with an associated one of the source diffusion regions 10S of the n-channel MOS transistors 10. The wiring patterns 52 are each allocated to a plurality of the n-channel MOS transistors 10. Accordingly, a plurality of the wiring patterns 52 respectively allocated to the n-channel MOS transistors 10 in the cell region N1 are arrayed in the x direction, and a plurality of the wiring patterns 52 respectively allocated to the n-channel MOS transistors 10 in the cell region N2 are also arrayed in the x direction. The wiring patterns 52 are each connected to an associated one of the source diffusion regions 10S via contact plugs 35 provided to penetrate through the interlayer dielectric film 41. The wiring pattern 53 extends in a ring shape so as to overlap with the well contact diffusion region 33. The wiring pattern 53 and the well contact diffusion region 33 are connected to each other via a plurality of contact plugs 34 provided to penetrate through the interlayer dielectric film 41. The wiring patterns 54 each extend in the y direction so as to overlap with an associated one of the source diffusion regions 20S of the p-channel MOS transistors 20. The wiring patterns 54 are each allocated to a plurality of the p-channel MOS transistors 20. Accordingly, a plurality of the wiring patterns 54 respectively allocated to the p-channel MOS transistors 20 in the cell region P1 are arrayed in the x direction, and a plurality of the wiring patterns 54 respectively allocated to the p-channel MOS transistors 20 in the cell region P2 are also arrayed in the x direction. The wiring patterns 54 are each connected to an associated one of the source diffusion regions 20S via contact plugs 37 provided to penetrate through the interlayer dielectric film 41.

The wiring patterns 55 each extend in the y direction so as to overlap with an associated one of the drain diffusion regions 10D of the n-channel MOS transistors 10. The wiring patterns 55 are each allocated to a plurality of the n-channel MOS transistors 10. Accordingly, a plurality of the wiring patterns 55 respectively allocated to the n-channel MOS transistors 10 in the cell region N1 are arrayed in the x direction, and a plurality of the wiring patterns 55 respectively allocated to the n-channel MOS transistors 10 in the cell region N2 are also arrayed in the x direction. The wiring patterns 55 are each connected to an associated one of the drain diffusion regions 10D via contact plugs 36 provided to penetrate through the interlayer dielectric film 41. The wiring patterns 56 each extend in the y direction so as to overlap with an associated one of the drain diffusion regions 20D of the p-channel MOS transistors 20. The wiring patterns 56 are each allocated to a plurality of p-channel MOS transistors 20. Accordingly, a plurality of the wiring patterns 56 respectively allocated to the p-channel MOS transistors 20 in the cell region P1 are arrayed in the x direction, and a plurality of the wiring patterns 56 respectively allocated to the p-channel MOS transistors 20 in the cell region P2 are also arrayed in the x direction. The wiring patterns 56 are each connected to an associated one of the drain diffusion regions 20D via contact plugs 38 provided to penetrate through the interlayer dielectric film 41.

Each of the wiring patterns 57 is allocated to the gate electrodes 10G and 20G of a pair of an associated one of the n-channel MOS transistors 10 and an associated one of the p-channel MOS transistors 20. The wiring patterns 57 are each connected to the associated gate electrodes 10G and 20G via contact plugs (not shown). Accordingly, the associated gate electrodes 10G and 20G are short-circuited.

As shown in FIG. 6, wiring patterns 61 to 66 are provided on the wiring layer L2. The wiring pattern 61 extends in the x direction so as to overlap with the well contact diffusion region 31 and the wiring pattern 51. The wiring pattern 61 and the wiring pattern 51 are isolated from each other. The wiring pattern 61 has a section 61A extending in the x direction, and a plurality of sections 61B branching from the section 61A toward the y direction. The section 61A overlaps with the well contact diffusion region 31 and the wiring pattern 51. The sections 61B each overlap with an associated one of the wiring patterns 52 and are connected to the associated wiring pattern 52 via contact plugs 81 provided to penetrate through the interlayer dielectric film 42. The wiring patterns 62 extend in the x direction so as to overlap with the well contact diffusion region 33 and the wiring pattern 53. The wiring patterns 62 and the wiring pattern 53 are insulated from each other. The wiring patterns 62 each have a section 62A extending in the x direction, and a plurality of sections 62B branching from the section 62A toward the y direction. The section 62A overlaps with the well contact diffusion region 33 and the wiring pattern 53. The sections 62B each overlap with an associated one of the wiring patterns 54 and are each connected to the associated one of the wiring patterns 54 via contact plugs 82 provided to penetrate through the interlayer dielectric film 42.

The wiring patterns 63 each extend in the y direction so as to overlap with the drain diffusion regions 10D and 20D of a pair of an associated one of the n-channel MOS transistors 10 and an associated one of the p-channel MOS transistors 20. The wiring patterns 63 are each connected to associated ones of the wiring patterns 55 and 56 via contact plugs 83 and 84 provided to penetrate through the interlayer dielectric film 42. Accordingly, the drain diffusion region 10D of each of the n-channel MOS transistors 10 and the drain diffusion region 20D of an associated one of the p-channel MOS transistors 20 are short-circuited. The wiring patterns 64 are each provided so as to overlap with the gate electrodes 10G and 20G of a pair of an associated one of the n-channel MOS transistors 10 and an associated one of the p-channel MOS transistors 20. The wiring patterns 64 are each connected to an associated one of the wiring patterns 57 via contact plugs 85 provided to penetrate through the interlayer dielectric film 42.

The wiring patterns 65 are provided at locations overlapping with both ends of the wiring pattern 51 in the x direction, respectively. The wiring patterns 65 are connected to the wiring pattern 51 via contact plugs 86 provided to penetrate through the interlayer dielectric film 42. The wiring patterns 66 are provided at locations not overlapping with the wiring pattern 62 in the wiring pattern 53, respectively. The wiring patterns 66 are connected to the wiring pattern 53 via contact plugs 87 provided to penetrate through the interlayer dielectric film 42.

Figure 7:
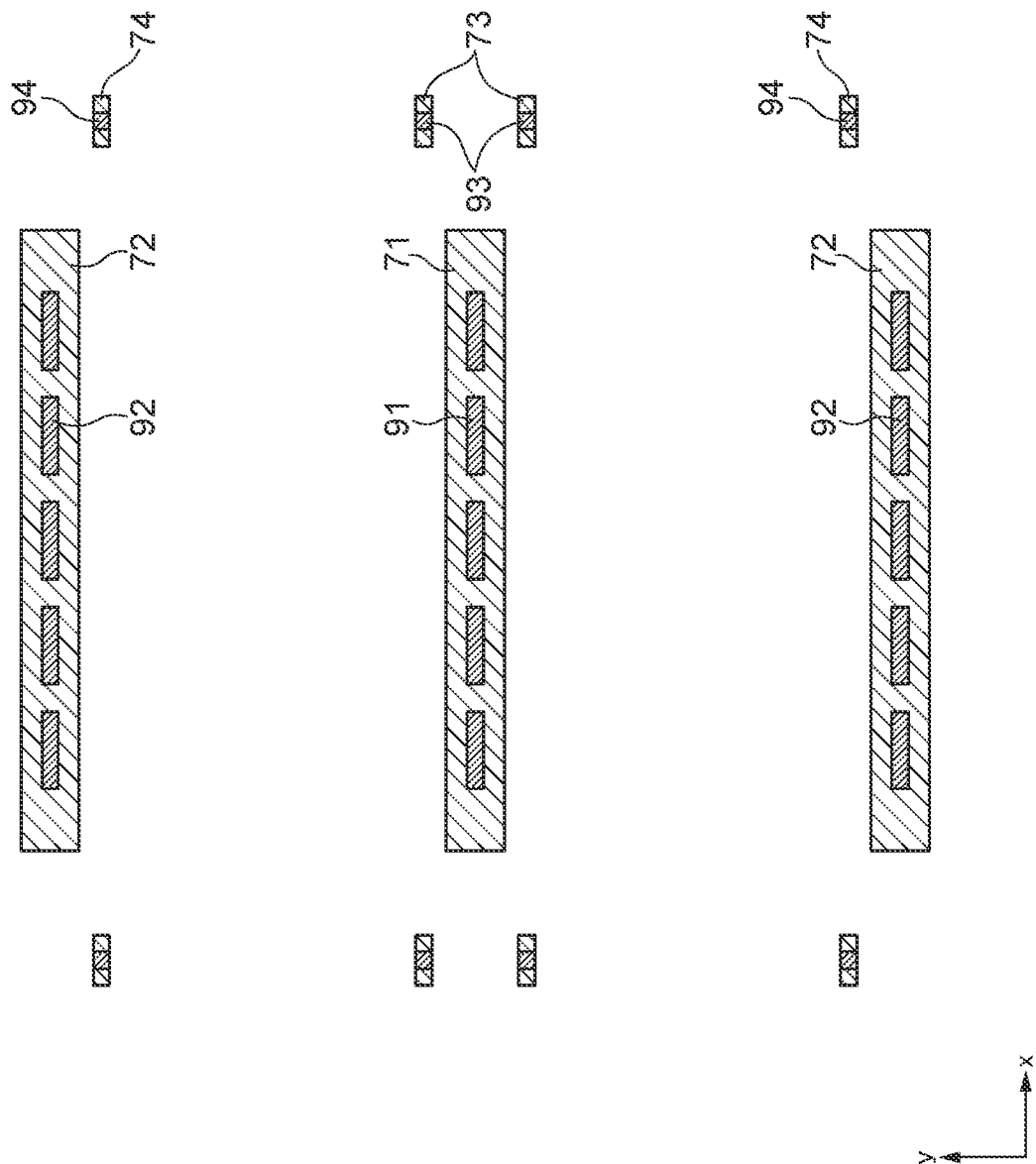
FIG. 7 is a schematic plan view in which a third wiring layer is shown as the layer is extracted from the plan view of FIG. 1.

As shown in FIG. 7, wiring patterns 71 to 74 are provided on the wiring layer L3. The wiring pattern 71 extends in the x direction so as to overlap with the well contact diffusion region 31, the wiring pattern 51, and the section 61A of the wiring pattern 61. The wiring pattern 71 is connected to the wiring pattern 61 via a plurality of contact plugs 91 provided to penetrate through the interlayer dielectric film 43. The contact plugs 91 are arrayed in the x direction. The wiring patterns 72 each extend in the x direction so as to overlap with the well contact diffusion region 33, the wiring pattern 53, and an associated one of the sections 62A of the wiring patterns 62. The wiring patterns 72 are each connected to the associated one of the wiring patterns 62 via contact plugs 92 provided to penetrate through the interlayer dielectric film 43. The wiring patterns 73 are provided at locations overlapping with the wiring patterns 65 and are connected to the wiring patterns 65 via contact plugs 93 provided to penetrate through the interlayer dielectric film 43, respectively. The wiring patterns 74 are provided at locations overlapping with the wiring patterns 66 and are connected to the wiring patterns 66 via contact plugs 94 provided to penetrate through the interlayer dielectric film 43, respectively.

Figure 8:
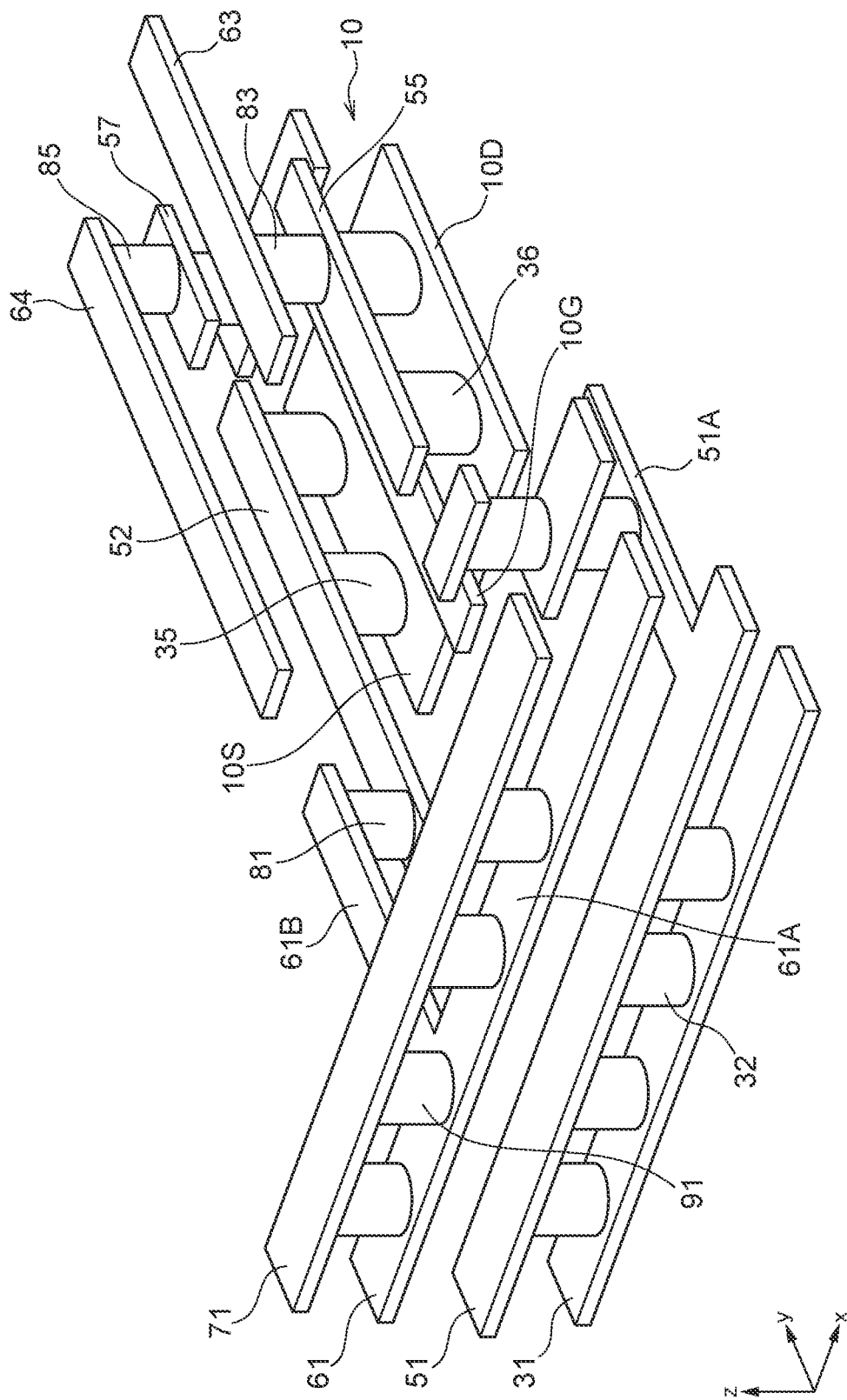
FIG. 8 is a schematic perspective view showing a configuration of a main part of the semiconductor device according to the present disclosure.

With this configuration, the well potential VPW supplied to the p-well region 6 is supplied to the well contact diffusion region 31 via the wiring patterns 73, the contact plugs 93, the wiring patterns 65, the contact plugs 86, the wiring pattern 51, and the contact plugs 32. Since the wiring pattern 51 extends in the x direction so as to overlap with the well contact diffusion region 31 and the wiring pattern 51 is connected to the well contact diffusion region 31 via the contact plugs 32, the resistance of paths supplying the well potential VPW to the p-well region 6 can be lowered. Accordingly, a pitch in which paths 51A supplying the well potential VFW to the wiring pattern 51 are provided can be increased as shown in FIG. 8. The array pitch of the contact plugs 32 can be shorter than that of the contact plugs 91. Similarly, because the well contact diffusion region 33 is connected to the wiring pattern 53 via the contact plugs 34, the resistance of paths supplying the well potential VNW to the n-well region 8 can be lowered.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a well region having a first conductivity type formed in a semiconductor substrate;
a first diffusion region formed in the well region, the first diffusion region having the first conductivity type and extending in a first direction;
a plurality of second diffusion regions formed in the well region, the second diffusion regions having a second conductivity type, the second diffusion regions being arranged in the first direction;
a first metallic line extending in the first direction so as to overlap with the first diffusion region;
a plurality of second metallic lines each extending in a second direction so as to overlap with an associated one of the second diffusion regions;
a third metallic line extending in the first direction so as to overlap with the first metallic line and each of the second metallic lines;
a plurality of first contact plugs arranged in the first direction, the first contact plugs electrically connecting the first metallic line to the first diffusion region;
a plurality of second contact plugs each electrically connecting an associated one of the second metallic lines to an associated one of the second diffusion regions; and
a plurality of third contact plugs each electrically connecting the third metallic line to an associated one of the second metallic lines.

2. The apparatus of claim 1, wherein the first and second metallic lines are provided on a same wiring layer.

3. The apparatus of claim 2,
wherein the first and second metallic lines are provided on a first wiring layer, and
wherein the third metallic line is provided on a second wiring layer located above the first wiring layer.

4. The apparatus of claim 3, wherein the first metallic line is isolated from the second and third metallic lines.

5. The apparatus of claim 4, further comprising:
a fourth metallic line extending in the first direction so as to overlap with the third metallic line and;
a plurality of fourth contact plugs arranged in the first direction, the fourth contact plugs electrically connecting the fourth metallic line to the third metallic line.

6. The apparatus of claim 5, wherein the fourth metallic line is provided on a third wiring layer located above the second wiring layer.

7. The apparatus of claim 6, wherein the first diffusion region, the first metallic line, the third metallic line, and the fourth metallic line overlap with one another.

8. The apparatus of claim 6, wherein a pitch of the first contact plugs is shorter than that of the fourth contact plugs.

9. The apparatus of claim 1, wherein the first diffusion region is greater in dopant concentration than the well region.

10. The apparatus of claim 1; further comprising a plurality of transistors arranged in the first direction,
wherein each of the second diffusion regions is configured as a source diffusion region of an associated one of the transistors.

11. An apparatus comprising:
a first well region having a first conductivity type formed in a semiconductor substrate,
a first well contact diffusion region having the first conductivity type formed in the first well region, the first well contact diffusion region extending in a first direction;
a plurality of first transistors arranged in the first direction along the first well contact diffusion region, each of the first transistors including a source diffusion region having a second conductivity type opposite to the first conductivity type formed in the first well region;
a first wiring layer including a first power line and a plurality of second power lines, the first power line extending in the first direction so as to overlap with the first well contact diffusion region, each of the second power lines extending in a second direction different from the first direction so as to overlap with the source diffusion region of an associated one of the first transistors;
a second wiring layer including a third power line having a first section extending in the first direction so as to overlap with the first power line and a plurality of second sections each branching from a first edge of the first section and extending in the second direction so as to overlap with an associated one of the second power lines;
a plurality of first contact plugs arranged along the first well contact diffusion region and the first power line so as to electrically connect to each other;
a plurality of second contact plugs each electrically connecting the source diffusion region of an associated one of the first transistors to an associated one of the second power lines; and
a plurality of third contact plugs each electrically connecting an associated one of the second power lines to an associated one of the second sections of the third power line.

12. The apparatus of claim 11, further comprising:
a third wiring layer including a fourth power line extending in the first direction so as to overlap with the first section of the third power line; and
a plurality of fourth contact plugs arranged along the first section of the third power line so as to electrically connect the fourth power line to the third power line.

13. The apparatus of claim 12, wherein a pitch of the first contact plugs is shorter than that of the fourth contact plugs.

14. The apparatus of claim 12, further comprising a plurality of second transistors arranged in the first direction along the first well contact diffusion region such that the first well contact diffusion region is arranged between the first and second transistors, each of the second transistors including a source diffusion region having the second conductivity type formed in the first well region,
wherein the first wiring layer further includes a plurality of fifth power lines each extending in the second direction so as to overlap with the source diffusion region of an associated one of the second transistors,
wherein the third power line further has a plurality of third sections each branching from a second edge of the first section opposite to the first edge and extending in the second direction so as to overlap with an associated one of the fifth power lines,
wherein the apparatus further comprises:
a plurality of fifth contact plugs each electrically connecting the source diffusion region of an associated one of the second transistors to an associated one of the fifth power lines; and
a plurality of sixth contact plugs each electrically connecting an associated one of the fifth power lines to an associated one of the third sections of the third power line.

15. The apparatus of claim 12, further comprising:
a second well region having the second conductivity type formed in the semiconductor substrate;
a second well contact diffusion region having the second conductivity type formed in the second well region, the second well contact diffusion region extending in the first direction; and
a plurality of second transistors arranged in the first direction along the second well contact diffusion region, each of the second transistors including a source diffusion region having the first conductivity type formed in the second well region,
wherein the first wiring layer further includes a fifth power line and a plurality of sixth power lines, the fifth power line extending in the first direction so as to overlap with the second well contact diffusion region, each of the sixth power lines extending in the second direction so as to overlap with the source diffusion region of an associated one of the second transistors,
wherein the second wiring layer further includes a seventh power line having a third section extending in the first direction so as to overlap with the fifth power line and a plurality of fourth sections each branching from the third section and extending in the second direction so as to overlap with an associated one of the sixth power lines,
wherein the apparatus further comprises:
a plurality of fifth contact plugs arranged along the second well contact diffusion region and the fifth power line so as to electrically connect to each other;
a plurality of sixth contact plugs each electrically connecting the source diffusion region of an associated one of the second transistors to an associated one of the sixth power lines; and
a plurality of seventh contact plugs each electrically connecting an associated one of the sixth power lines to an associated one of the fourth sections of the seventh power line.

16. The apparatus of claim 15,
wherein the third wiring layer further includes an eighth power line extending in the first direction so as to overlap with the third section of the seventh power line, and
wherein the apparatus further comprises a plurality of eighth contact plugs arranged along the third section of the seventh power line so as to electrically connect the eighth power line to the seventh power line.

17. The apparatus of claim 16,
wherein each of the first transistors further includes a drain diffusion region having the second conductivity type formed in the first well region,
wherein each of the second transistors further includes a drain diffusion region having the first conductivity type formed in the second well region, and
wherein the drain diffusion region of each of the first transistors is electrically, connected to the drain diffusion region of an associated one of the second transistors.

18. The apparatus of claim 17,
wherein the second wiring layer further includes a plurality of ninth lines extending in the second direction, and
wherein the drain diffusion region of each of the first transistors is electrically connected to the drain diffusion region of an associated one of the second transistors via an associated one of the ninth lines.

19. The apparatus of claim 18,
wherein each of the first transistors further includes a gate electrode formed on a channel region located between the source and drain diffusion regions,
wherein each of the second transistors further includes a gate electrode formed on a channel region located between the source and drain diffusion regions, and
wherein the gate electrode of each of the first transistors is electrically connected to the gate electrode of an associated one of the second transistors.

* * * * *